(12) United States Patent
Chen et al.

(10) Patent No.: US 9,130,072 B1
(45) Date of Patent: Sep. 8, 2015

(54) BACKSIDE ILLUMINATED IMAGE SENSOR AND METHOD OF MANUFACTURING THE SAME

(71) Applicant: TAIWAN SEMICONDUCTOR MANUFACTURING COMPANY LTD., Hsinchu (TW)

(72) Inventors: Chiu-Jung Chen, Tainan (TW); Chen-Chun Chen, Tainan (TW); Fu-Tsun Tsai, Tainan (TW); Chi-Cherng Jeng, Tainan (TW); Hsin-Chi Chen, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/252,980

(22) Filed: Apr. 15, 2014

(51) Int. Cl.
*H01L 31/0216* (2014.01)
(52) U.S. Cl.
CPC .................................. *H01L 31/02161* (2013.01)

(58) Field of Classification Search
USPC .................................................. 257/432, 459
See application file for complete search history.

(56) References Cited

U.S. PATENT DOCUMENTS

| | | | |
|---|---|---|---|
| 2011/0266645 A1* | 11/2011 | Chao | 257/432 |
| 2012/0025199 A1* | 2/2012 | Chen et al. | 257/75 |
| 2012/0205769 A1* | 8/2012 | Tsai et al. | 257/460 |
| 2014/0252521 A1* | 9/2014 | Kao et al. | 257/432 |
| 2015/0060774 A1* | 3/2015 | Liang et al. | 257/40 |

* cited by examiner

*Primary Examiner* — Thao P Le
(74) *Attorney, Agent, or Firm* — Chun-Ming Shih

(57) ABSTRACT

A backside illuminated (BSI) image sensor device includes a substrate including a front side and a back side; a radiation-sensing region in the substrate; a metal post with a longitudinal height and disposed over the back side; and a color filter adjacent to the metal post and substantially over the radiation-sensing region. The radiation-sensing region is configured to detect a radiation wave entering from the back side.

20 Claims, 16 Drawing Sheets

BACKSIDE ILLUMINATED IMAGE SENSOR AND METHOD OF MANUFACTURING THE SAME

FIELD

The present disclosure relates to a semiconductor image sensor.

BACKGROUND

Semiconductor image sensors are used for sensing light. Complementary metal-oxide-semiconductor (CMOS) image sensors (CIS) and charge-coupled device (CCD) sensors are widely used in various applications such as digital still camera or mobile phone camera applications.

A backside illuminated (BSI) image sensor device is one type of image sensor device. Image pixels in the BSI image sensor device generate electrical signals in response to incident light. Magnitudes of the electrical signals depend on the intensity of the incident light received by the respective image pixels. However, as the size of transistor devices shrinks with each technological generation, existing BSI image sensor devices may begin to suffer from issues related to electrical or optical crosstalk. These issues may be caused by insufficient isolation between neighboring image pixels of the BSI image sensor device. Thus, a sufficient isolation structure is required.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
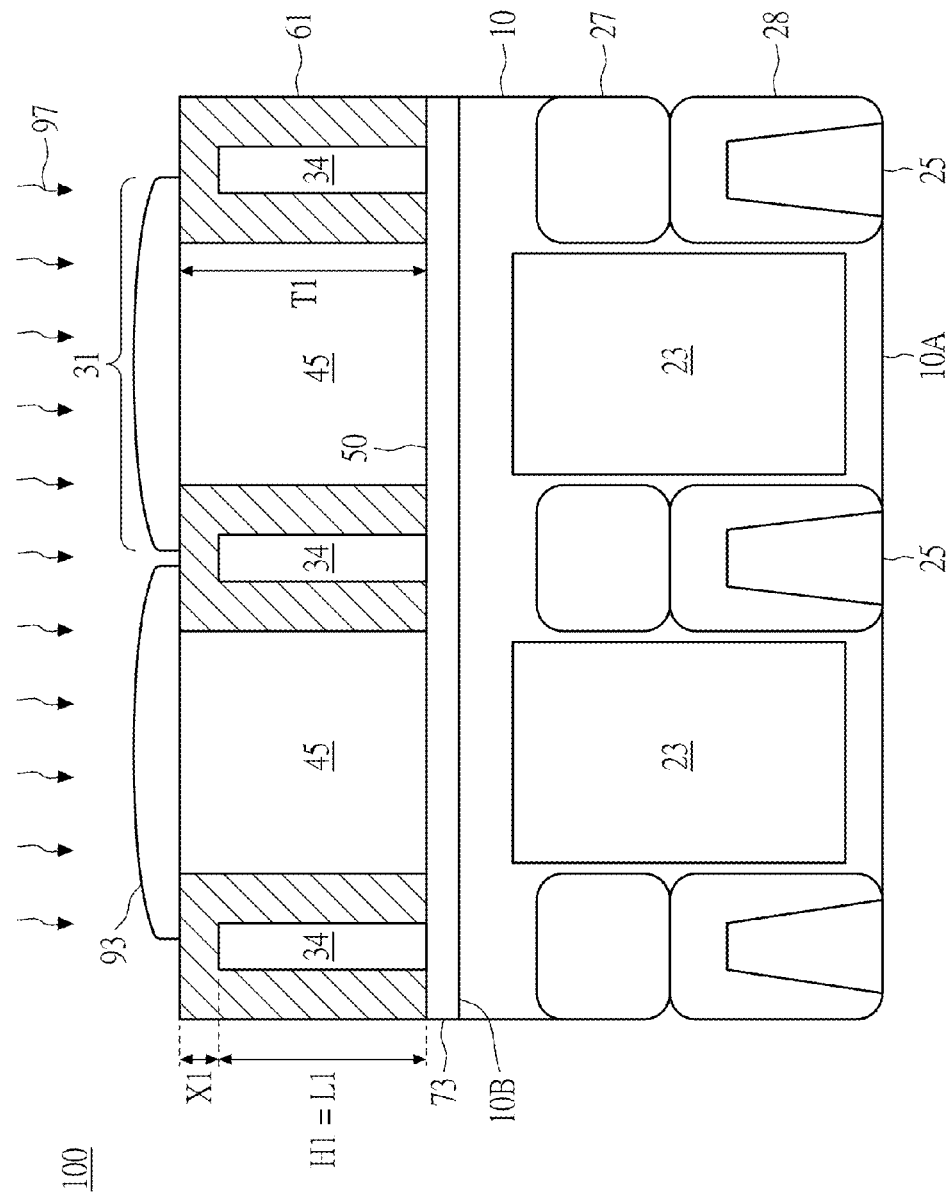
FIG. 1 is a cross-sectional view illustrating a backside illuminated (BSI) image sensor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An "image pixel", as used herein, refers to a device used to capture photons, and generate electrical signals from the received photons. In some embodiments, the image pixel includes a photodiode, a transfer transistor, a floating diffusion region, a reset transistor, a source follower (common drain amplifier), and a select transistor, which is typically called a 4-T image sensor. It should be appreciated that embodiments of the present disclosure are not limited to 4-T image pixel architectures; rather, one of ordinary skill in the art having the benefit of the instant disclosure will understand that the present disclosure is also applicable to 3T designs, 5T designs, and various other image pixel architectures. During operation, incident light is received by the photodiode. Electron-hole pairs are generated in response to the received light. The electrons are then collected in the photodiode, and transferred to the floating diffusion region by way of the transfer transistor. Later, the electrons are converted into electrical signals to be received. The reset transistor is coupled between a power VDD and the floating diffusion region so as to reset the floating diffusion region to a preset voltage. The floating diffusion region is coupled to control the gate of the source follower. The source follower is coupled between the power VDD and the select transistor. The source follower is configured to provide an infinite input resistance reduced to a small output resistance. The source follower is typically used as a voltage buffer. Such resistance reduction provides combination for a more ideal voltage source. Finally, the select transistor selectively couples the output of the image pixel to a readout column line or a readout row line.

The terms "wafer" and "substrate," as used herein, are to be understood as including silicon, silicon-on-insulator (SOI) technology, silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous processing steps may have been utilized to form regions, junctions, or material layers in or over the base semiconductor structure or foundation. In addition, the semiconductor need not be silicon-based, but could be based on silicon-germanium, germanium, gallium arsenide or other semiconductor structures.

The term "isolation," as used herein, refers to an oxide structure or a dielectric structure for isolating devices. There are two typical formation processes, one is Local Oxidation of Silicon (LOCOS) and the other is Shallow Trench Isolation (STI). In an image sensor, the isolation is disposed between imaging pixels and adjacent imaging pixels so as to isolate the adjacent imaging pixels. In addition, the isolation is configured to act as a barrier to keep charge carriers (holes or electrons) from penetrating into an adjacent imaging pixel.

The terms "deposition" and "deposit," as used herein, refer to operations of depositing materials on a substrate using a vapor phase of a material to be deposited, a precursor of the material, and an electrochemical reaction or sputtering/reactive sputtering. Depositions using a vapor phase of a material include any operations such as, but not limited to, chemical vapor deposition (CVD) and physical vapor deposition (PVD). Examples of vapor deposition methods include hot filament CVD, rf-CVD, laser CVD (LCVD), conformal diamond coating operations, metal-organic CVD (MOCVD), thermal evaporation PVD, ionized metal PVD (IMPVD), electron beam PVD (EBPVD), reactive PVD, atomic layer deposition (ALD), plasma enhanced CVD (PECVD), high density plasma CVD (HDPCVD), low pressure CVD (LPCVD), and the like. Examples of deposition using an electrochemical reaction include electroplating, electro-less plating, and the like. Other examples of deposition include pulse laser deposition (PLD) and atomic layer deposition (ALD).

In general, a metal grid is disposed on a back side of a substrate. An oxide layer fills up the metal grid. Later, color filters are disposed over the oxide layer and the metal grid. Each color filter may be deposited adjacent to another color filter without any separations. Sometimes, overlay performances of the color filters are not good enough, for example, the color filters may shift. Each color filter may mismatch with wrong photodiodes. In other situation, obliquely incident light may cross through at least two color filters. The color filters may also induce optical crosstalk. In an embodiment, the present disclosure increases a height of the metal grid to separate adjacent color filters, which reduces optical crosstalk. Meanwhile, the problem of color filter mismatch can be solved due to the increased height of the metal grid.

Shallow trench isolations isolate adjacent image pixels on a front side of the substrate. However, the radiation wave has to travel about 2 microns into the substrate. The shallow trench isolations are relatively shallow and located on the front side. The shallow trench isolations cannot serve as a grid structure in the substrate so that crosstalk may occur. Further, the relatively short depth of the shallow trench isolations is insufficient for isolating the radiation waves that enter from the back side. Photons that enter from the back side may go under or around the shallow trench isolations in order to reach adjacent image pixels or radiation-sensing regions. This results in crosstalk between the image pixels. In an embodiment, the present disclosure increases the length of the metal grid in order to separate adjacent photo diodes, thus reducing optical crosstalk.

In reference to the Figures, FIG. 1 is a cross-sectional view illustrating a backside illuminated (BSI) image sensor device 100 in accordance with some embodiments of the present disclosure. The BSI image sensor device 100 includes a substrate 10, radiation-sensing regions 23, metal posts 34, color filters 45, and micro lenses 93.

The substrate 10 further includes a front side 10A and a back side 10B. The radiation-sensing regions 23 are disposed in the substrate 10. Further, the radiation-sensing regions 23 are arranged in an array manner. Shallow trench isolations 25 are located on the front side 10A. The shallow trench isolations 25 separate adjacent radiation-sensing regions 23. Shallow p-type regions 28 surround the shallow trench isolations 25. Deep p-type regions 27 are disposed adjacent to the shallow p-type regions 28. The deep p-type regions 27 are relatively deeper than the shallow p-type regions 28 from the front side 10A. The metal posts 34 are disposed over the back side 10B. The metal posts 34 are horizontally separated from a distance. The distance is equivalent to a width of a radiation-sensing region 23. The metal posts 34 individually align with the shallow trench isolations 25. Each color filter 45 is in a corresponding unit cell 31.

The radiation-sensing regions 23 are part of image pixels (not shown) and is configured to detect a radiation wave 97 that enters from the back side 10B of the substrate 10. The radiation-sensing regions 23 are implemented as a photodiode, a pinned photodiode, or a p-n junction disposed in the substrate 10. The radiation wave 97 induces the radiation-sensing regions 23 to generate electron-hole pairs in a depletion region of the radiation-sensing regions 23.

The shallow trench isolations 25 are disposed adjacent to the radiation-sensing regions 23. Further, the shallow trench isolations 25 define active regions of the image pixels on the front side 10A. Material of the shallow trench isolation 25 includes dielectric materials, such as silicon oxide or silicon nitride. The shallow trench isolation 25 has a depth that is less than about 1 um extended from the front side 10A.

Shallow p-type regions 28 surround the shallow trench isolations 25. Deep p-type regions 27 are disposed deeper into the substrate 10. The p-type regions include dopants such as boron, germanium, or indium. The p-type regions are able to deplete electrons near a boundary of the p-type regions. The p-type regions thus serve as a block to prevent electrons within the radiation-sensing regions 23 from crossing to an adjacent radiation-sensing region, which reduces electrical crosstalk between radiation-sensing regions.

An oxide layer 61 is interposed between a metal post 34 and a color filter 45. Sidewalls of the metal posts 34 are covered with the oxide layer 61. A top surface of the metal post 34 is also deposited with the oxide layer 61. The oxide layer 61 includes a thickness in a range between about 10 angstroms to 1000 angstroms. The oxide layer 61 is configured to protect the metal posts 34 from oxidation during processing. In an embodiment, the oxide layer 61 is made of reflective materials. As such, the metal posts 34 reflect the radiation wave 97 when photons of the radiation wave 97 hit the metal posts 34 so as to guide the radiation wave 97 into radiation-sensing regions 23.

Each color filter 45 is disposed adjacent to a metal post 34 and substantially over the radiation-sensing regions 23. Further, the color filters 45 are arranged in an array manner over the back side 10B. Each of the color filters 45 aligns with a corresponding one of the radiation-sensing regions 23. The color filters 45 include a thickness T1 substantially higher than a longitudinal height H1 of the metal posts 34. On the other hand, the thickness T1 is substantially equal to a total height summed up by the longitudinal height H1 and a thickness X1 of the oxide layer 61 above the metal post 34. The longitudinal height H1 of the metal posts 34 is measured from a surface 50 toward the back side 10B. That is, the metal posts 34 have a length L1 at least extending longitudinally to the surface 50. The surface 50 refers to a bottom surface of a color filter 45 which is coplanar with a bottom surface of the metal posts 34. That is, the metal posts 34 separate adjacent color filters 45. The color filters 45 are configured to filter visible light, such as a red, green, or blue wavelength. The color filters 45 include suitable material for optical structures. For example, the color filters 45 include a dye-based (or pigment-based) polymer for filtering out a specific frequency band. Alternatively, the color filters 45 include a resin or other organic-based material having color pigments.

Figure 2:
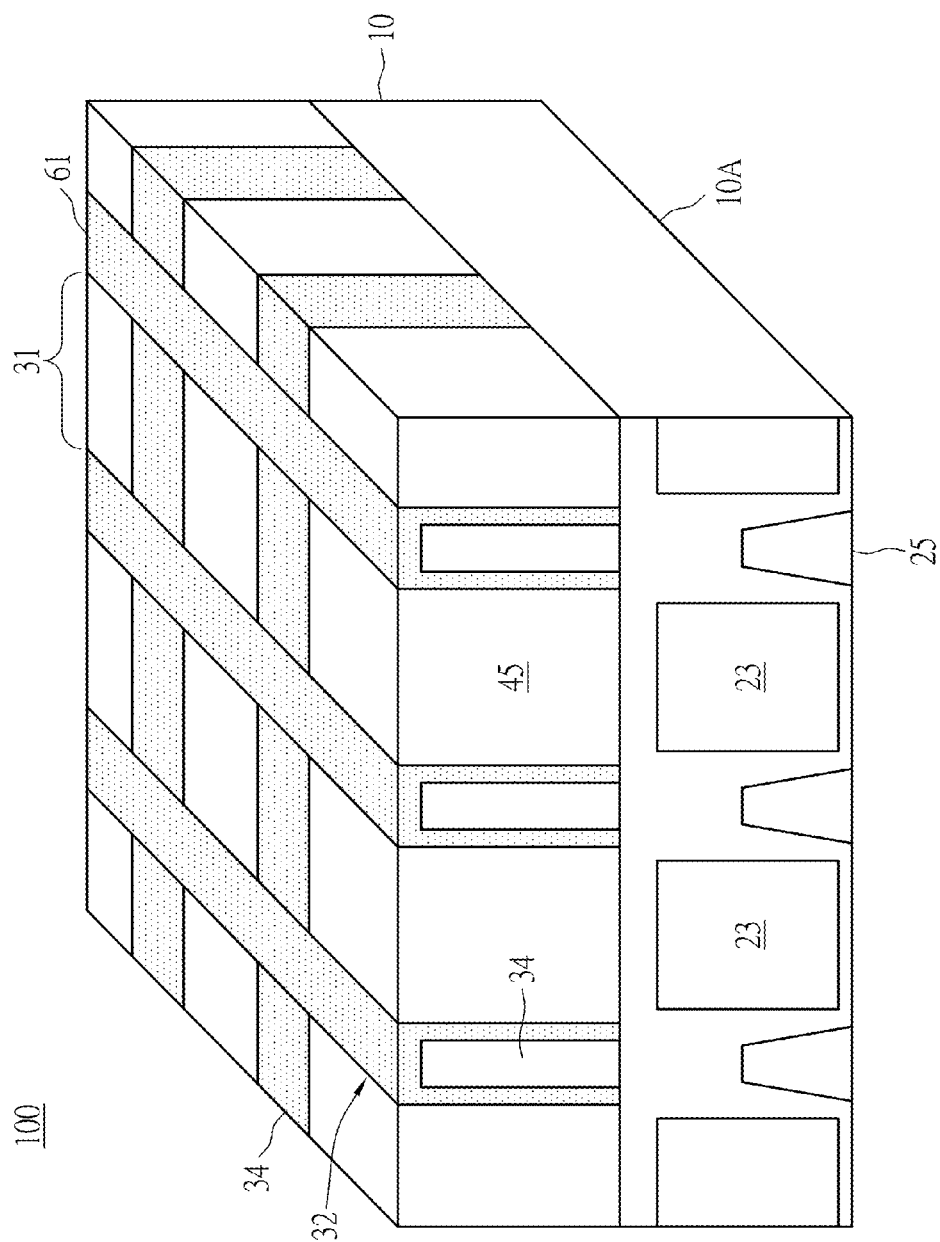
FIG. 2 is a perspective view illustrating a backside illuminated (BSI) image sensor device in accordance with some embodiments of the present disclosure.

FIG. 2 is a perspective view illustrating the BSI image sensor device 100 in accordance with some embodiments of the present disclosure. Metal posts 34 construct a metal grid 32. A first plurality of parallel metal posts 34 is arranged in a first direction, and a second plurality of parallel metal posts 34 is arranged in a second direction. The first direction is orthogonal to the second direction so as to form a metal grid 32. The metal grid 32 can be regarded as a checkerboard pattern. The metal grid 32 defines a plurality of unit cells 31. Each unit cell 31 is filled with the color filters 45. The metal grid 32 is configured to guide radiation waves into the radiation-sensing regions 23. In some embodiments, the metal grid 32 is made of reflective materials, for example, AlCu, W or SiN. Further, the oxide layer 61 also conformally covers the metal grid 32. The oxide layer 61 protects the metal grid 32 from oxidation.

Each unit cell 31 aligns with a radiation-sensing region 23 respectively, therefore a color filter 45 filled in a unit cell 31 is designated to align with a corresponding radiation-sensing region 23. Obliquely incident light is retained only in one color filter because adjacent color filters 45 are separated by a metal post 34. Effectively, the radiation wave 97 is guided to a designated radiation-sensing region 23 so that optical crosstalk is reduced.

The metal post 34 can be designed in various shapes. In some embodiments, the metal post 34 is in conical shape. The bottom surface of the metal post 34 is coplanar with the surface 50. The vertex of the metal post 34 is at a distal end from the surface 50. The metal post 34 provides a different shape of the unit cells 31 which enhances collection of the radiation wave 97. In an embodiment, the vertex of the metal post 34 is disposed on the surface 50. The bottom surface of the metal post 34 is away from the surface 50.

Referring back to FIG. 1, a micro lens 93 is disposed over the color filter 45 and the metal post 34. The micro lens 93 is configured to focus the radiation wave 97 on the radiation-sensing region 23. The micro lens 93 includes a suitable material with a variety of shapes and sizes depending on an index of refraction of the material.

A high-k dielectric film 73 is disposed between the surface 50 and the back side 10B. Since the metal posts 34 have a length L1 at least extending longitudinally to the surface 50, the high-k dielectric film 73 orthogonally intersects with the metal posts 34. The high-k dielectric film 73 includes negative charges so that positive charges or holes are accumulated near the back side 10. Since the charges are blocked and trapped therein, a leakage current or a dark current is prevented. In some embodiments, the high-k dielectric film 73 includes a dielectric metal oxide having a dielectric constant greater than 8.0, which is a characteristic of high-k dielectric materials. Exemplary high-k dielectric materials include $HfO_2$, $ZrO_2$, $La_2O_3$, $Al_2O_3$, and $TiO_2$.

Figure 3:
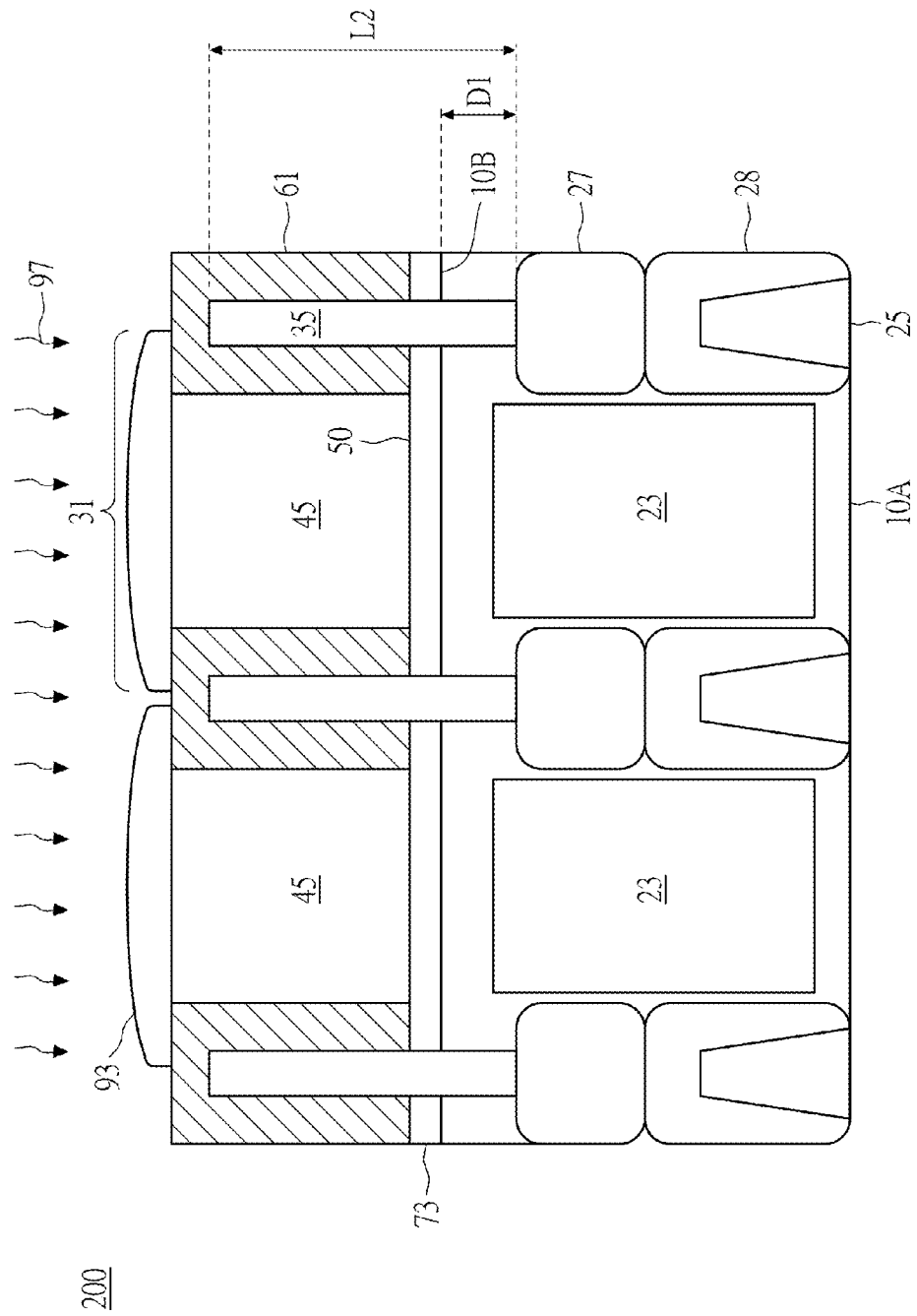
FIG. 3 is a cross-sectional view illustrating a backside illuminated (BSI) image sensor device in accordance with some embodiments of the present disclosure.

FIG. 3 is a cross-sectional view illustrating a backside illuminated (BSI) image sensor device 200 in accordance with some embodiments of the present disclosure. The BSI image sensor device 200 is similar to the BSI image sensor device 100 of FIG. 1. The difference is the design of the metal posts. A metal post 35, which is similarly disposed between adjacent color filters as the metal post 34 in FIG. 1, further extends into the substrate 10. The metal post 35 has a length L2 extending longitudinally to a predetermined position that is below the surface 50. The length L2 is in a range from about 0.6 microns to 4.4 microns. For some embodiments as in FIG. 3, the metal post 35 extends into the substrate 10 with a depth D1 in a range from about 0.55 microns to 4.4 microns. The depth D1 is measured from the back side 10B to an end of the metal post 35 in the substrate 10. The metal post 35 also contacts with the deep p-type doped regions 27. Therefore, adjacent radiation-sensing regions 23 are separated by the p-type doped region 27 and the metal post 35. Photons of the radiation wave 97 entering the substrate 10 are reflected by the metal post 35 and thoroughly received by the radiation-sensing regions 23. The metal post 35 provides benefits to prevent the photons from scattering into an adjacent radiation-sensing region. In addition, the p-type doped region also serves as a block to prevent electrons from penetrating into adjacent radiation-sensing region. Thus, the combination of the metal post 35 and the p-type doped regions reduces optical and electrical crosstalk.

Figure 4:
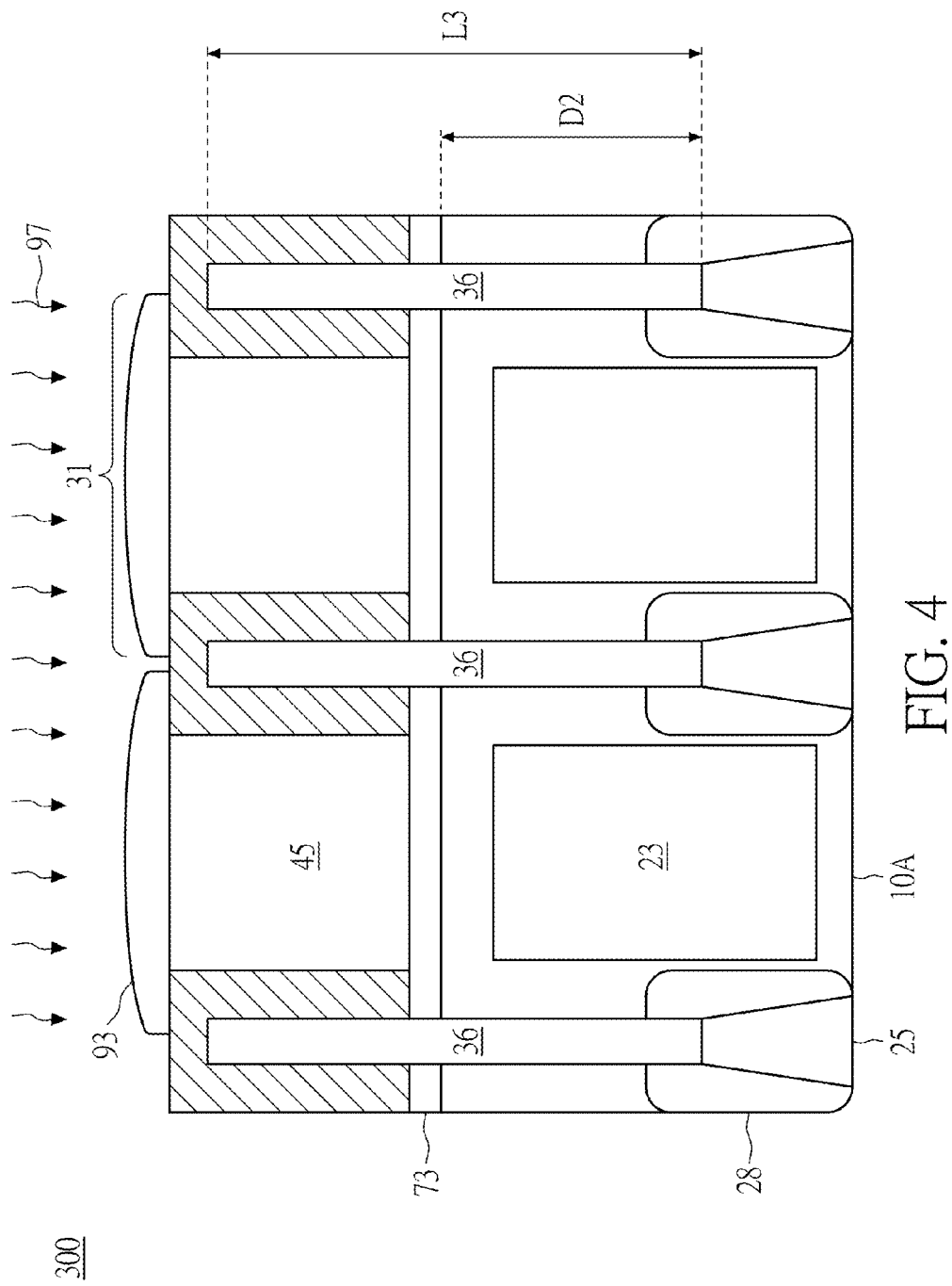
FIG. 4 is a cross-sectional view illustrating a backside illuminated (BSI) image sensor device in accordance with some embodiments of the present disclosure.

FIG. 4 is a cross-sectional view illustrating a backside illuminated (BSI) image sensor device 300 in accordance with some embodiments of the present disclosure. The BSI image sensor device 300 is similar to the BSI image sensor device 200 of FIG. 3. The difference is the metal post 36 extends into the substrate 10 and contacts with the shallow trench isolations 25. That is, the metal post 36 has a length L3 extending longitudinally below the surface 50 and further reaches at the shallow trench isolations 25. The length L3 is in a range from about 2.4 microns to 6.55 microns. The metal post 36 extends into the substrate 10 with a depth D2 in a range from about 1.9 microns to 5.75 microns. The depth D2 is measured from the back side 10B to an end of the metal post 36 in the substrate 10. Similar to the embodiments as in FIG. 3, the combination of the metal post 36 and the shallow trench isolations 25 reduces electrical crosstalk between adjacent radiation-sensing regions 23.

Figure 5:
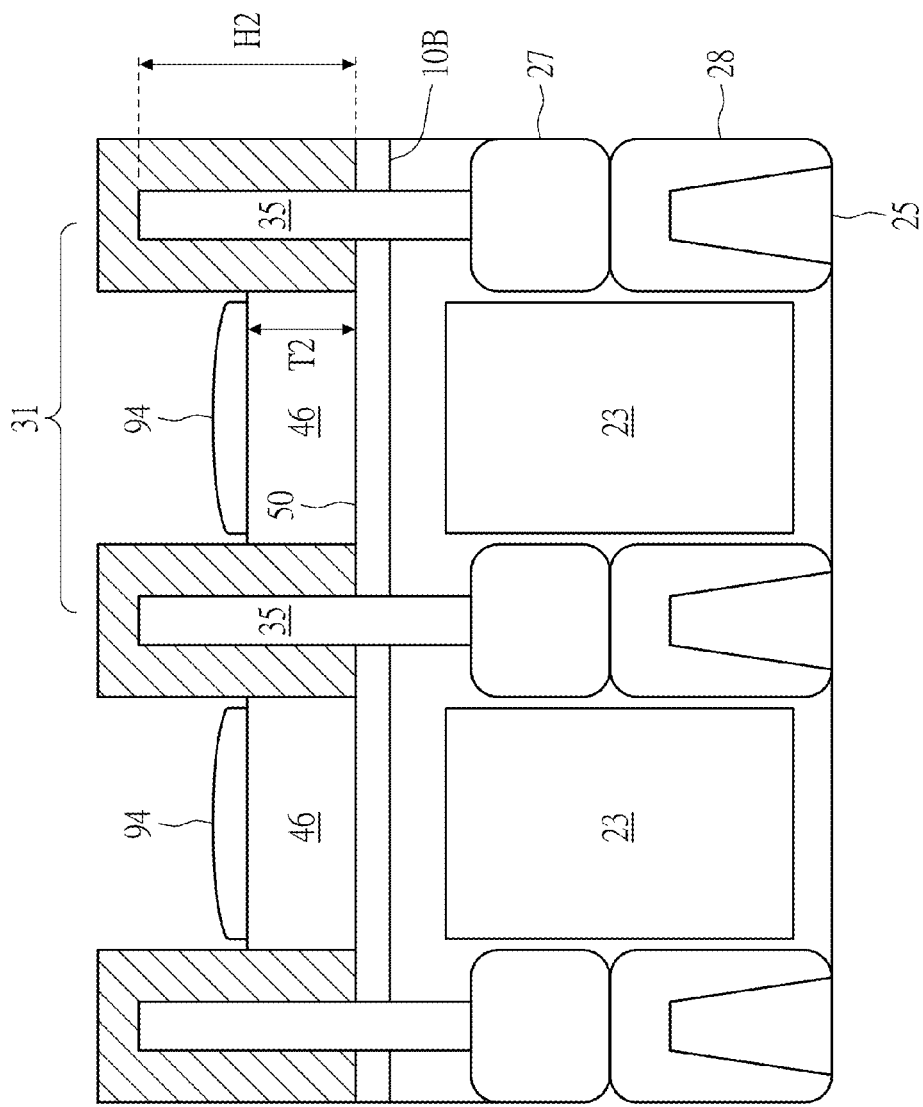
FIG. 5 is a cross-sectional view illustrating a backside illuminated (BSI) image sensor device in accordance with some embodiments of the present disclosure.

FIG. 5 is a cross-sectional view illustrating a backside illuminated (BSI) image sensor device 400 in accordance with some embodiments of the present disclosure. The BSI image sensor device 400 is similar to the BSI image sensor device 200 of FIG. 3, however, the thickness of the color filter 46 is designed in different configuration. The color filter 46 includes a thickness T2 substantially less than a longitudinal height H2 of the metal posts 35 that is measured from a surface 50. The surface 50 refers to a bottom surface of the color filter 46, which faces toward the back side 10B. Further, the metal posts 35 include a longitudinal height H2 which is higher than the thickness T2 of the color filters 46 measured from the surface 50. A micro lens 94 is disposed on the color filter 46 so that a total thickness of the color filter 46 and the micro lens 94 is substantially equal to or less than the longitudinal height H2 of the metal posts 35 measured from the surface 50. As an incident light penetrates into the micro lens 94, the micro lens 94 induces mirror refraction, which changes the direction of the incident light. Since the metal posts 35 are higher than the micro lens 94, the incident light is refracted inside the unit cell 31 without scattering into an adjacent color filter. As such, the influence of the refracted incident light can be reduced. In addition, the metal posts 35 reflect the incident light so that the incident light retained in one unit cell 31 does not penetrate into other adjacent unit cells. Therefore, the optical crosstalk can be reduced.

FIGS. 6A-6F represent a method of manufacturing a backside illuminated (BSI) image sensor device 100 as in FIG. 1 in accordance with some embodiments of the present disclosure. Each figure represents a stage of the method in a cross-sectional perspective view.

Figure 6A:
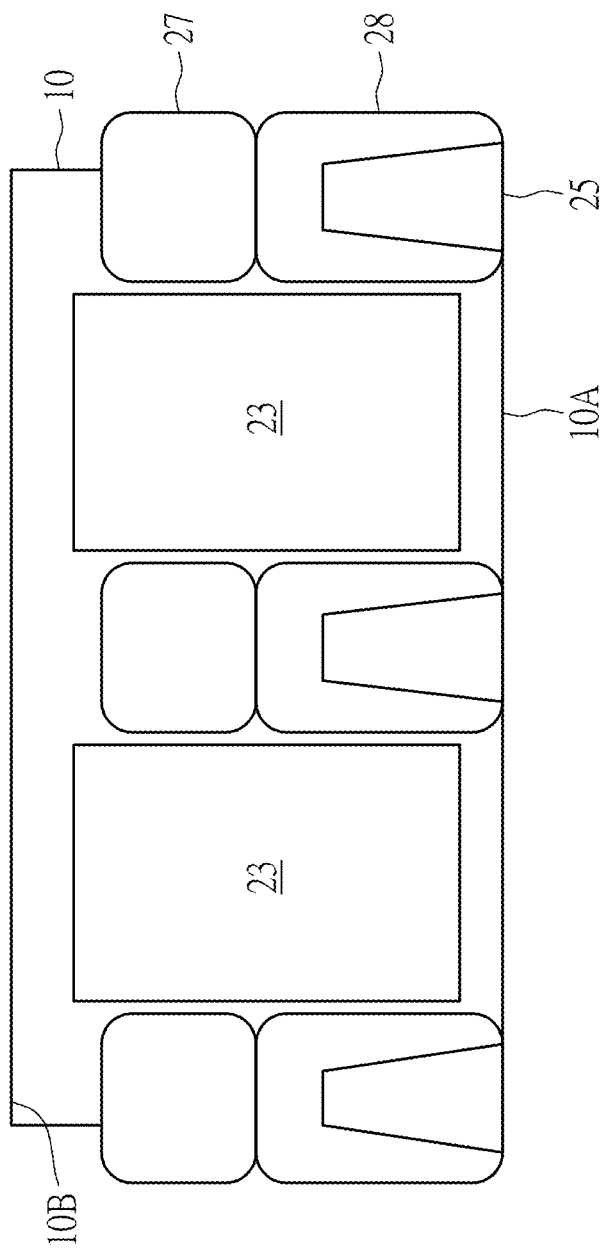
FIGS. 6A-6F represent a method of manufacturing a backside illuminated (BSI) image sensor device as in FIG. 1 in accordance with some embodiments of the present disclosure.

Referring to FIG. 6A, a substrate 10 having a front side 10A and a back side 10B is provided. A local oxidation of silicon (LOCOS) or a Shallow Trench Isolation (STI) process is performed to define active regions of image pixels. Thus, the substrate 10 includes shallow trench isolations 25 on the front side 10A configured to isolate adjacent image pixels. The shallow trench isolations 25 are formed by etching a shallow opening into the substrate 10 from the front side 10A and the opening is filled with an oxide material or a nitride material. In some embodiments, the shallow trench isolations 25 have a depth that is less than 1 um. In addition, at least one doping process is performed on the substrate 10, for example, an ion implantation. The ion implantation is used to form deep p-type doped regions 27 and shallow p-type doped regions 28. The ion implantation includes p-type dopants such as boron, germanium, and/or indium. Further, the ion implantation includes different levels of depth and energy.

Later, at least one image pixel is formed on the front side 10A. The image pixel is formed adjacent to shallow trench isolation 25. During formation of the image pixel, at least one ion implantation is employed to form radiation-sensing regions and floating diffusion regions with different levels of depth and energy. For example, an ion implantation is used to form radiation-sensing regions 23. The radiation-sensing regions 23 are formed by performing an ion implantation process on the front side 10A. The ion implantation process implants the substrate 10 separately with n-type and p-type dopants so as to form a photodiode or a pinned diode. Moreover, the radiation-sensing regions 23 are formed away from the front side 10A depending on the design needs and manufacturing requirements. The positions or configurations of the radiation-sensing regions 23 are adjusted by tuning an implantation energy level of the implantation process.

After the image pixel and the radiation-sensing regions 23 are formed, the substrate 10 is held by a carrier (not shown) and the back side 10B is in an upward position. A thinning process (not shown) is performed in order to thin the substrate 10 from the back side 10B. For example, the thinning process includes a Chemical Mechanical Polishing (CMP)/Planarization process. Alternatively, the thinning process includes a diamond scrubbing process, a grinding process, or other suitable techniques. A substantial amount of material may be removed from the back side 10B by using the thinning process. In an embodiment, the thinning process is performed until portions of the radiation-sensing regions are exposed. After the thinning process, the substrate 10 is thin enough so that the radiation-sensing regions can efficiently receive radiation waves that enter from the back side 10B.

Figure 6B:
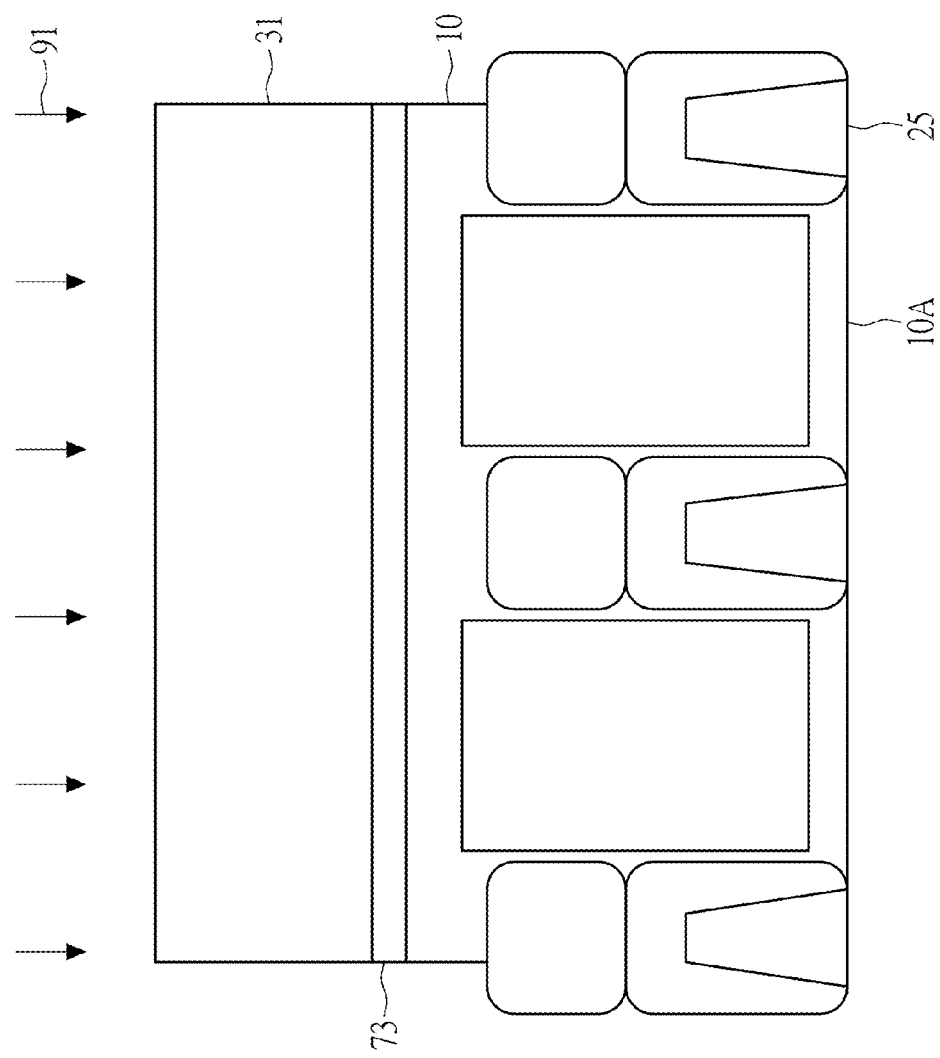

Referring to FIG. 6B, after the step of thinning, a high-k dielectric film 73 is formed on the back side 10B by a deposition process. The deposition process includes high-k dielectric materials such as $HfO_2$, $Ta_2O_5$, $ZrO_2$, or $Al_2O_3$. The deposition process uses a vapor phase of material including any operations such as, but not limited to, chemical vapor deposition (CVD) and physical vapor deposition (PVD). In some embodiments, buffer layers (not shown) are formed over the back side 10B. The buffer layer includes Bottom Anti-Reflective Coating (BARC) or a silicon oxide layer. It is appreciated that buffer layers may have different structures, be formed of different materials, and/or have a different number of layers other than illustrated.

Later, a deposition 91 is performed and illustrated as arrows. The deposition 91 includes a metal(s) or a metal alloy, for example, tungsten, aluminum, copper, and/or the like. Accordingly, a metal layer 31 is formed over the buffer layers and the high-k dielectric film 73. The metal layer 31 may have a single-layer structure with a single layer therein, or may have a composite structure including a plurality of stacked layers. Later, a photoresist layer (not shown) is formed over the metal layer 31.

Figure 6C:
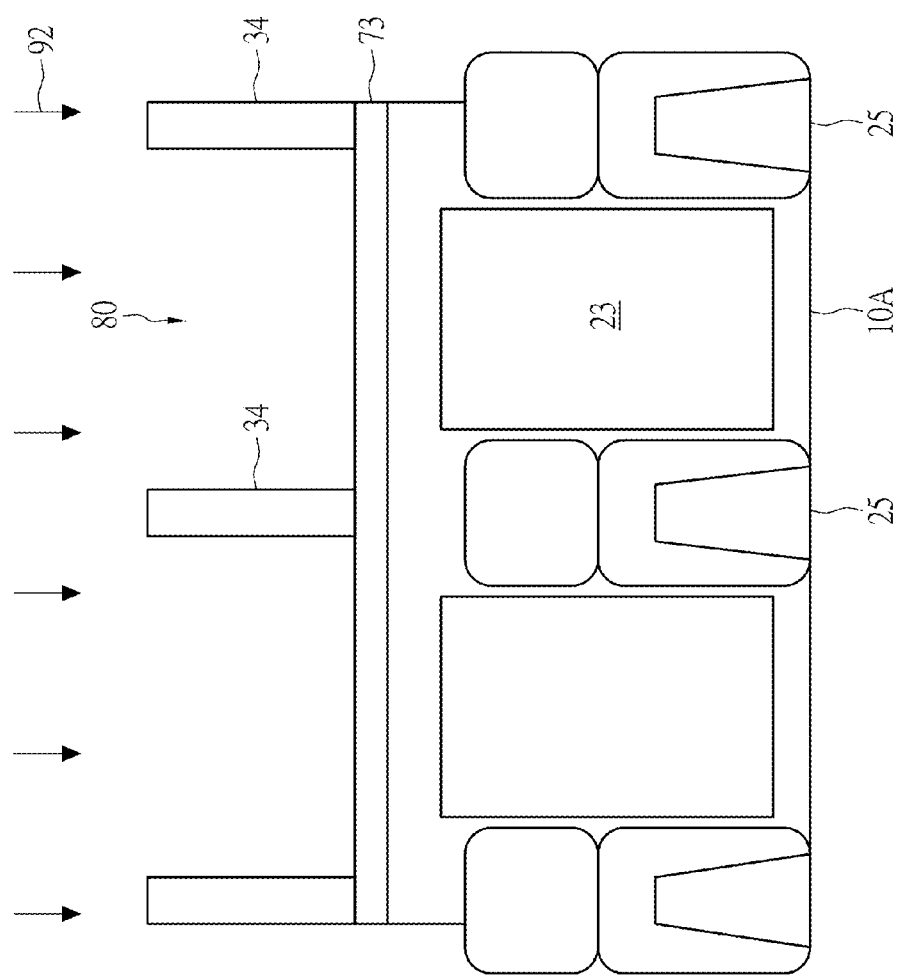

Referring to FIG. 6C, an etching process 92 is performed. In some embodiments, the etching process 92 is an anisotropic or an isotropic etch that includes a reactive ion etch (RIE) process. Still in some embodiments, the etching process 92 utilizes a dry or wet etching process. The metal layer 31 is etched to match the pattern of the photoresist layer so as to form a plurality of metal posts 34. As such, a cavity 80 and the metal posts 34 are formed over the back side 10B. The metal posts 34 horizontally stand with a predetermined distance that is approximate to a width of a radiation-sensing region 23. Each of the metal posts 34 align with a corresponding one of the shallow trench isolations 25 of the front side 10A. In an embodiment, an isotropic etching is used to encroach the metal layer 31 under the photoresist layer so as to form a metal post 34 in conical shape.

Figure 6D:
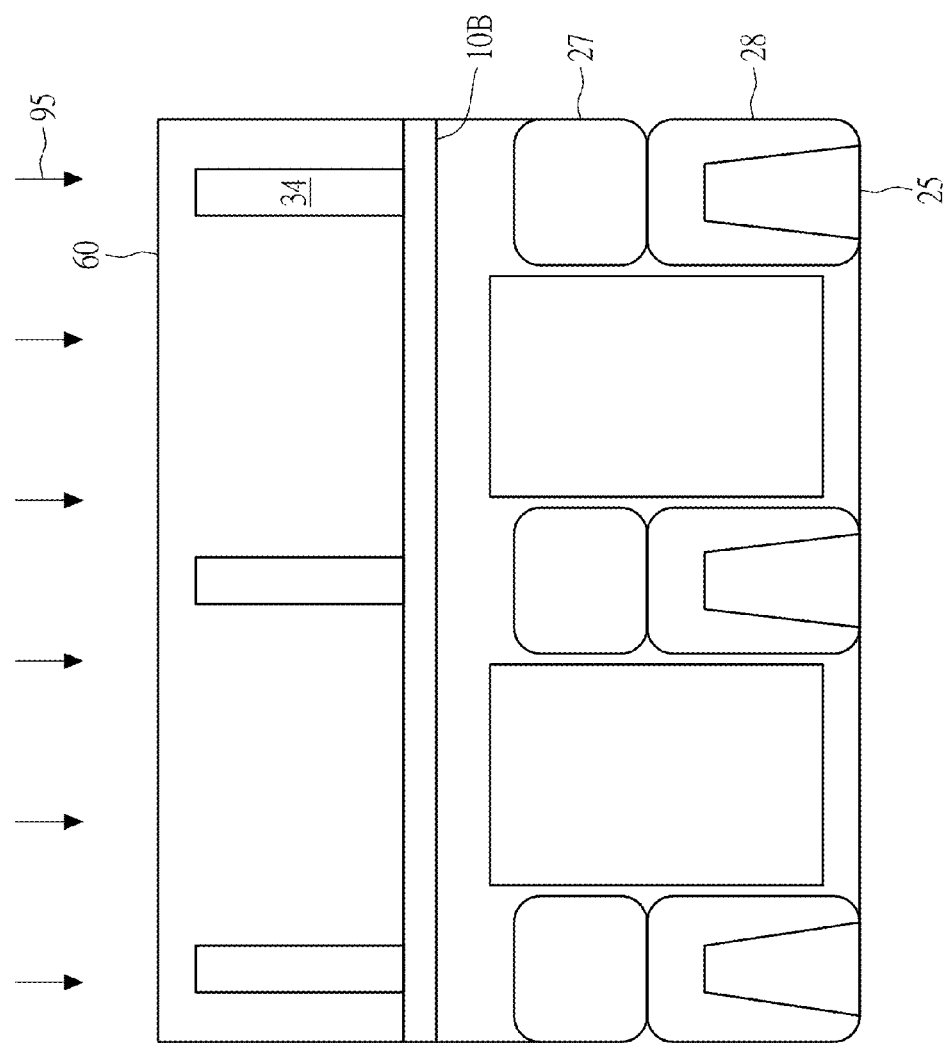

Referring to FIG. 6D, a deposition 95 illustrated as arrows is performed to form a dielectric layer 60. The deposition 95 includes dielectric materials, such as silicon oxide, silicon nitride, silicon carbon, or SiON. In an embodiment, the deposition 95 includes light absorbing material. The dielectric layer 60 is formed over the back side 10B and fills up the cavity 80. Since the metal posts 34 are vulnerable to oxidation, the dielectric layer 60 is used to protect the metal posts 34 from oxidizing during the next-stage processes.

Figure 6E:
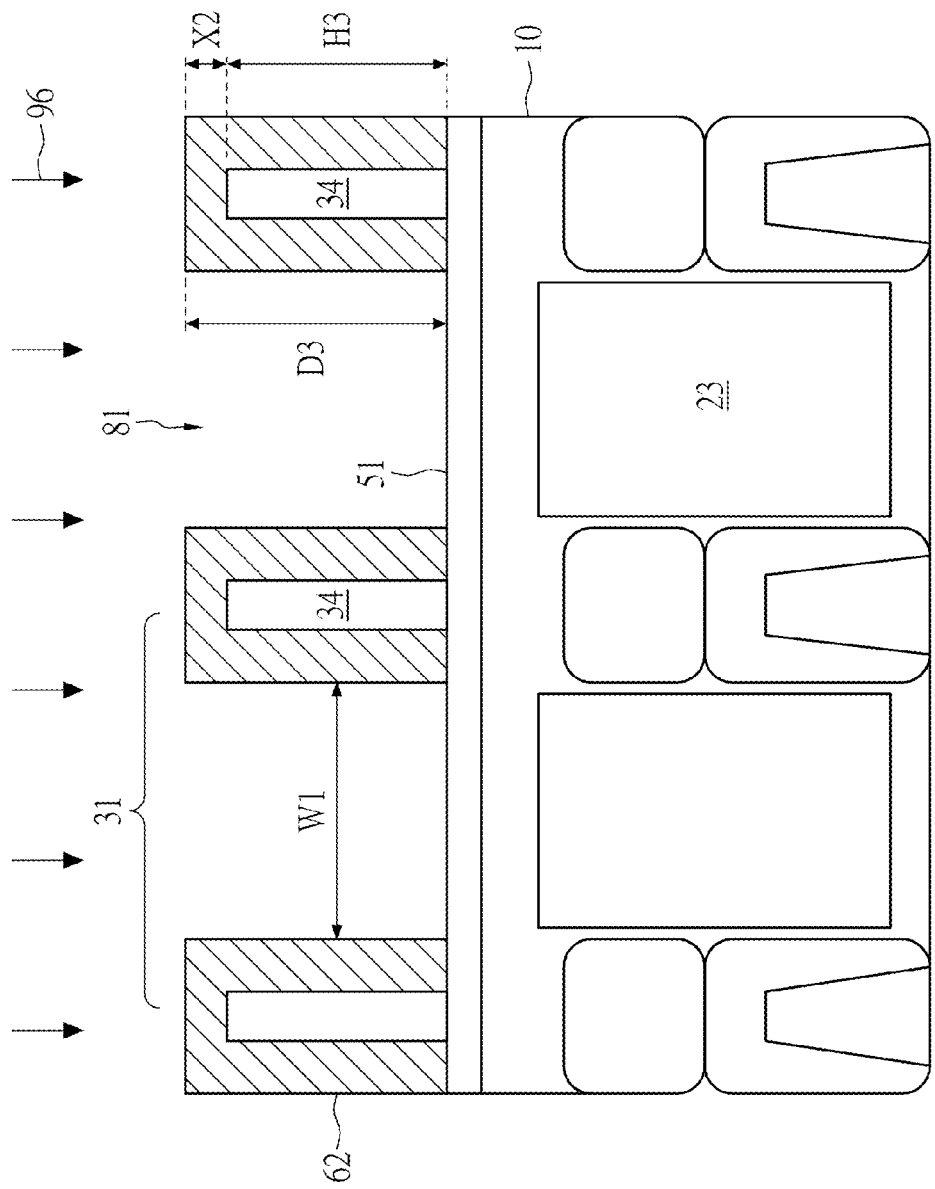

Later, a photoresist layer (not shown) is deposited and patterned on the dielectric layer 60. Referring to FIG. 6E, an etching process 96 is performed to remove a portion of the dielectric layer 60 resulting in a cavity 81 above the radiation-sensing regions 23. The cavity 81 includes an area of a bottom surface 51 which is smaller than each unit cell 31. In a lateral view, a width W1 of the cavity 81 is smaller than a distance between the metal posts 34. A depth D3 of the cavity 81 is approximate to a total height summed up by a thickness X2 of a remaining dielectric layer 62 above the metal posts 34 and a longitudinal height H3 of the metal posts 34 measured from the bottom surface 51. After the etching process 96, the remaining dielectric layer 62 attaches on the metal posts 34. The remaining dielectric layer 62 protects the metal posts 34 from oxidation.

Figure 6F:
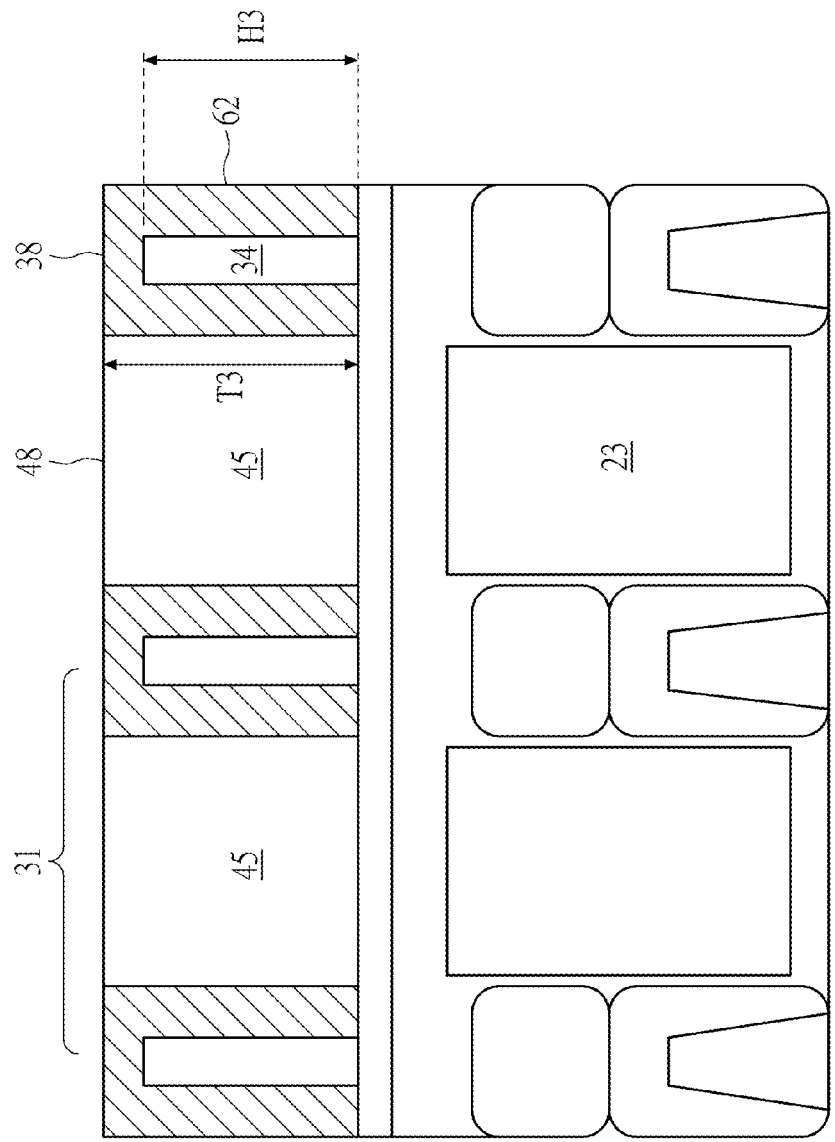

Referring to FIG. 6F, a color filter 45 is deposited within the cavity 81. The color filter 45 includes one of a variety of different colors, for example, red, green, blue, and white. The color filter 45 includes a thickness T3 substantially equal to or less than the depth D3 of the cavity 81. In an embodiment, a top surface 48 of the color filter 45 is generally coplanar with a top surface 38 of the dielectric layer 60. The color filter 45 includes a polymeric material or resin, such as a polymeric polymer, which includes colored pigments.

A micro lens (not shown) can be formed over the color filters 45 and the metal posts 34. The micro lens is formed by, for example, applying and patterning a positive type photoresist (not shown) over the color filters 45. Once formed, the patterned photoresist may then be baked to round the photoresist into a curved micro lens.

FIGS. 7A-7E represent a method of manufacturing a backside illuminated (BSI) image sensor device 200 as in FIG. 3 in accordance with some embodiments of the present disclosure. Each figure represents a stage of the method in a cross-sectional perspective view.

Figure 7A:
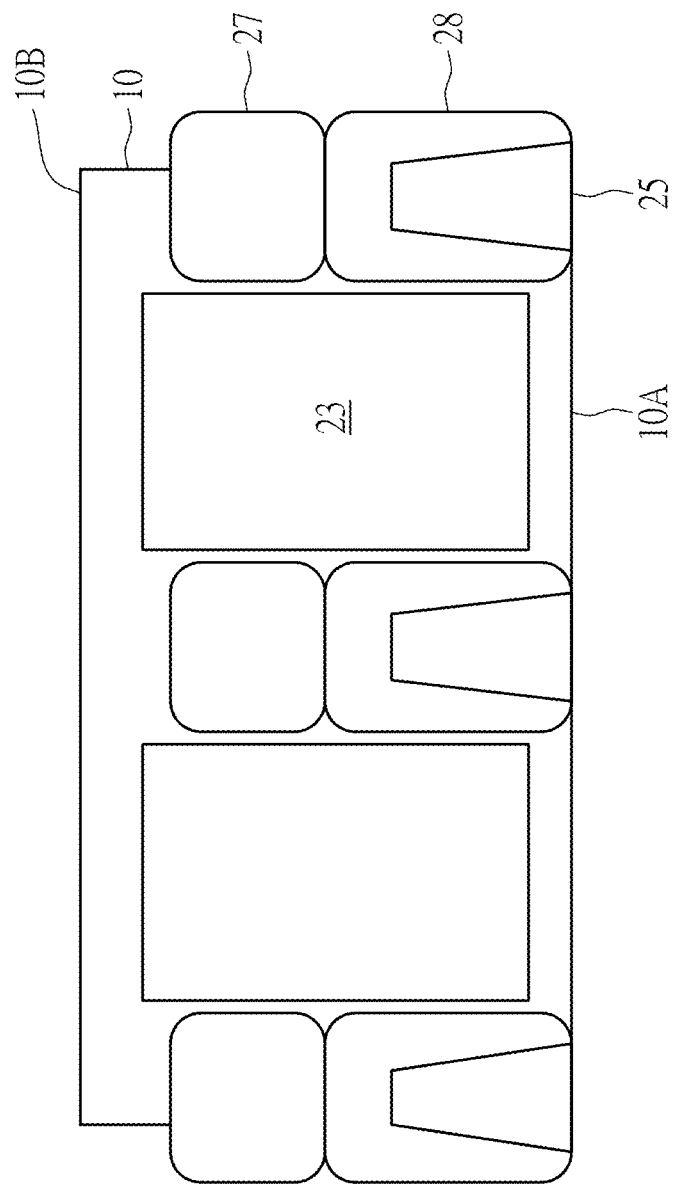
FIGS. 7A-7E represent a method of manufacturing a backside illuminated (BSI) image sensor device as in FIG. 3 in accordance with some embodiments of the present disclosure.

Referring to FIG. 7A, a substrate 10 having a front side 10A and a back side 10B is provided. The substrate 10 includes shallow trench isolations 25 on the front side 10A. At least one image pixel is also formed adjacent to the shallow trench isolations 25. Radiation-sensing regions 23, deep p-type doped regions 27 and shallow p-type doped regions 28 are formed in the substrate 10. A thinning process (not shown) is performed in order to thin down the substrate 10 from the back side 10B. After the step of thinning, a high-k dielectric film and buffer layers (not shown) are formed on the back side 10B by a deposition process.

Figure 7B:
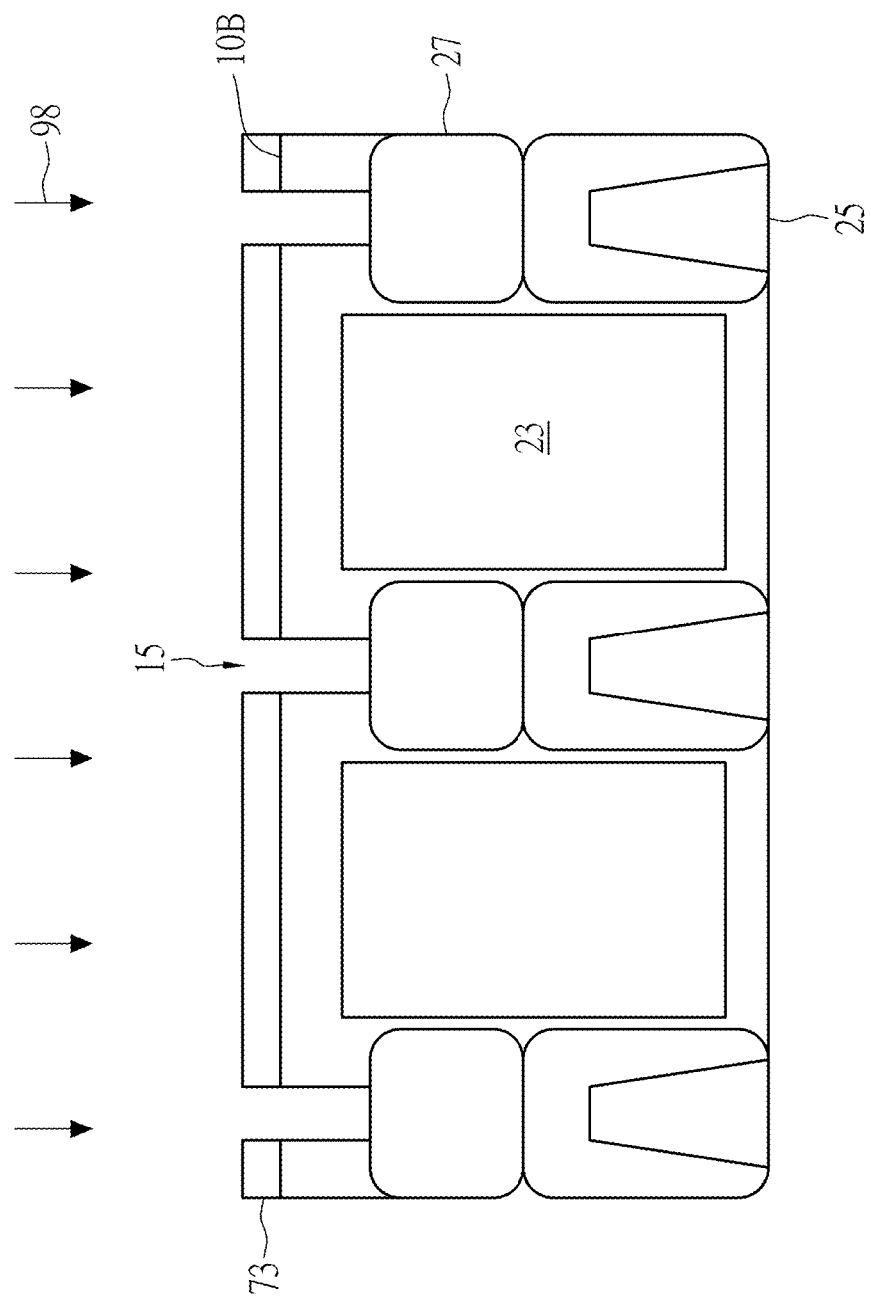

A photoresist layer (not shown) is deposited and patterned on the back side 10B. Referring to FIG. 7B, an etching process 98 is performed to etch the back side 10B and a high-k dielectric film 73 so as to form a trench 15 on the back side 10B. The trench 15 exposes the deep p-type doped regions 27 in the substrate 10 adjacent to the radiation-sensing regions 23.

Figure 7C:
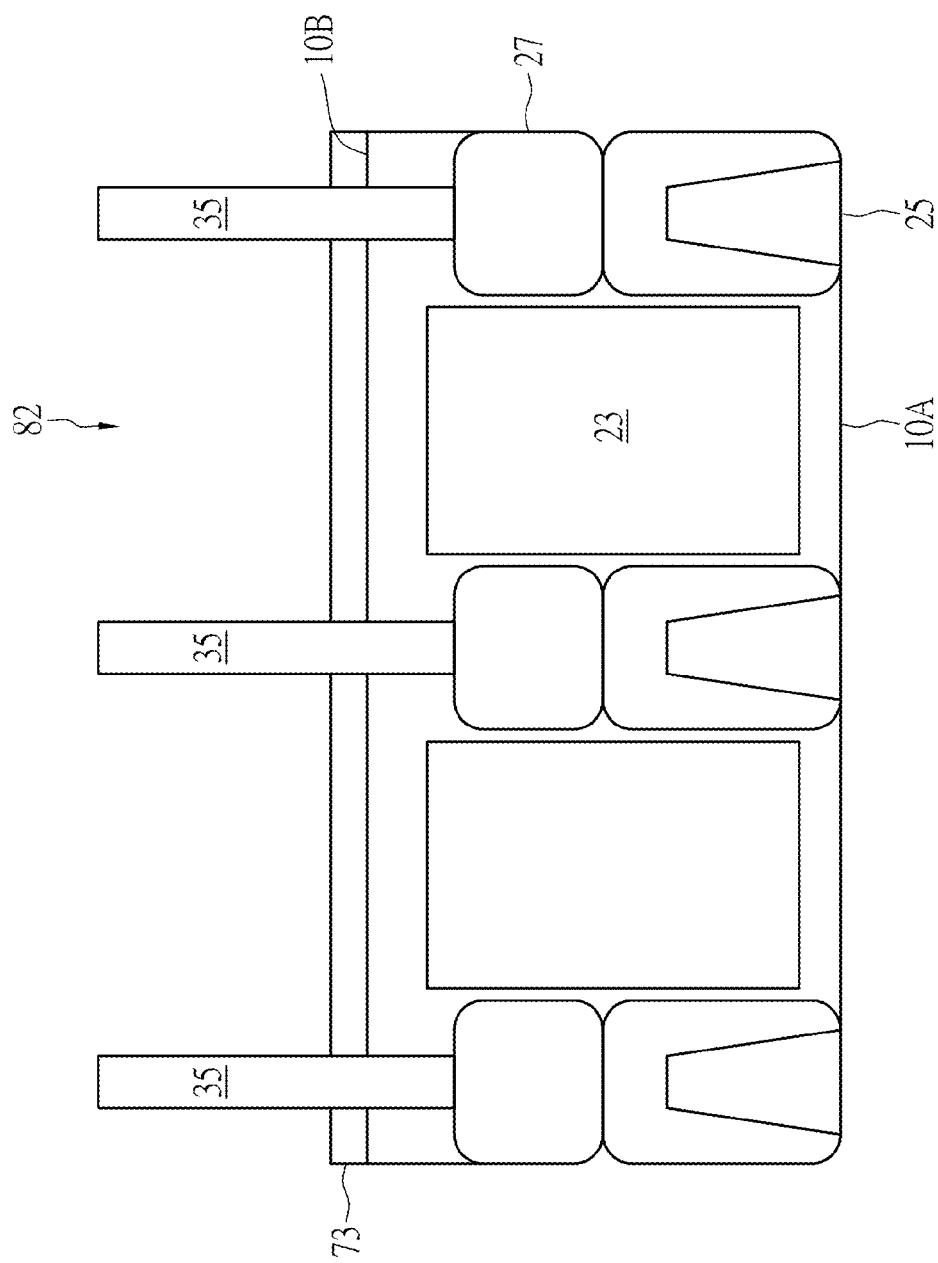

Referring to FIG. 7C, a deposition is performed to form a metal layer over the back side 10B so as to fill in the trench 15. The deposition includes a metal(s) or a metal alloy, for example, tungsten, aluminum, copper, and/or the like. Later, a photoresist layer (not shown) is formed over the metal layer. An etching process is performed to pattern the metal layer. The metal layer is thus etched to match the pattern of the photoresist layer so that a remaining portion of the metal layer forms several metal posts 35 and a cavity 82. The metal posts 35 horizontally stand with a predetermined distance that is approximate to a width of a radiation-sensing region 23. Each of the metal posts 35 aligns with a corresponding one of the shallow trench isolations 25 of the front side 10A. In addition, the metal posts 35 extend into the substrate 10.

Figure 7D:
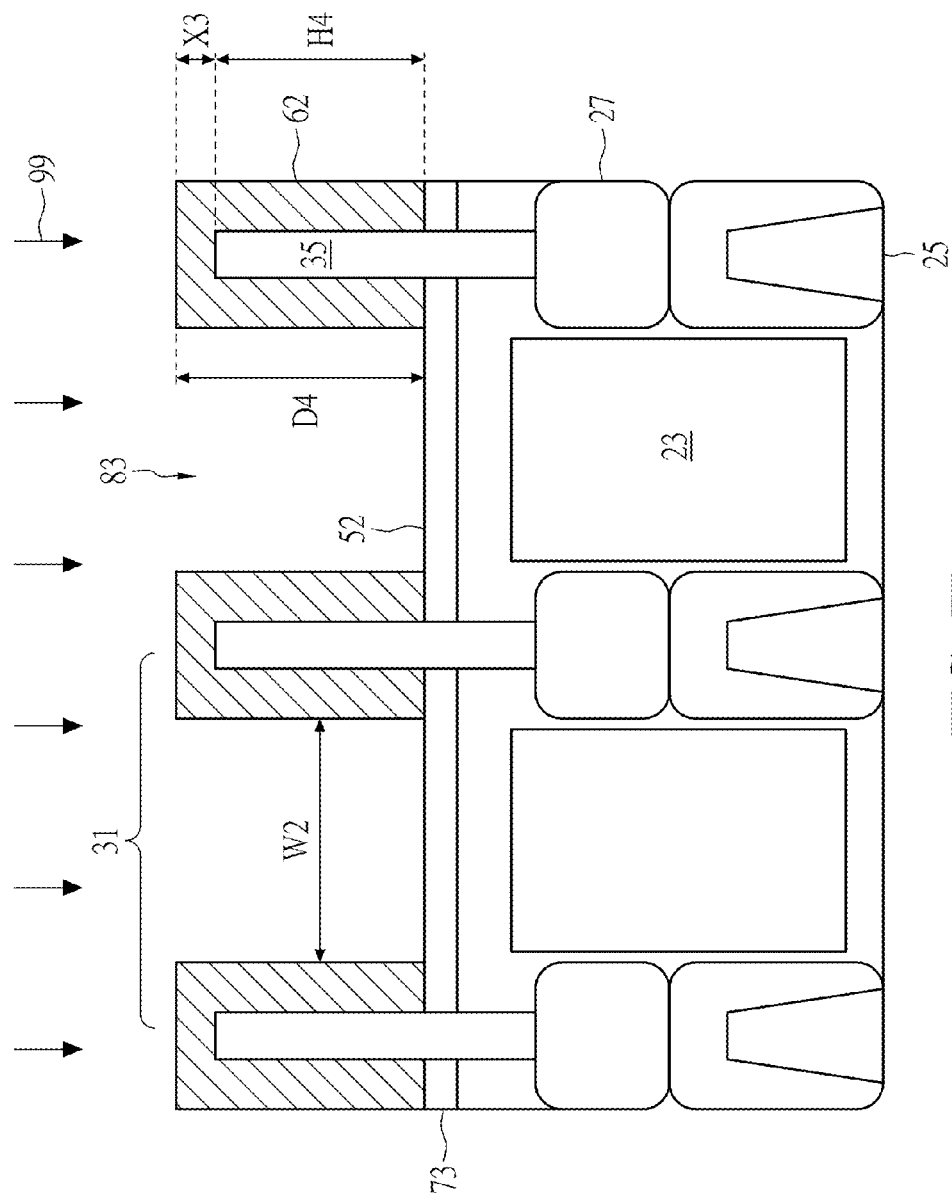

Referring to FIG. 7D, a deposition is performed to form a dielectric layer. The deposition includes dielectric materials such silicon oxide, silicon nitride, silicon carbon, or SiON. The dielectric layer is formed over the back side 10B and fills up the cavity 82. A photoresist layer (not shown) is formed and patterned over the dielectric layer. Later, an etching process 99 is performed to remove a portion of the dielectric layer resulting in a cavity 83 above the radiation-sensing regions 23. The cavity 83 includes an area of a bottom surface 52 that is smaller than that of a unit cell 31. In a lateral view, a width W2 of the cavity 83 is smaller than a distance between the metal posts 35. A depth D4 of the cavity 83 is approximate to a total height summed up by a thickness X3 of the dielectric layer above the metal posts 35 and a longitudinal height H4 of the metal posts 35 measured from the bottom surface 52. After the etching process 99, a remaining dielectric layer 62 attaches and covers on the metal posts 35. The remaining dielectric layer 62 protects the metal posts 35 from oxidation.

Figure 7E:
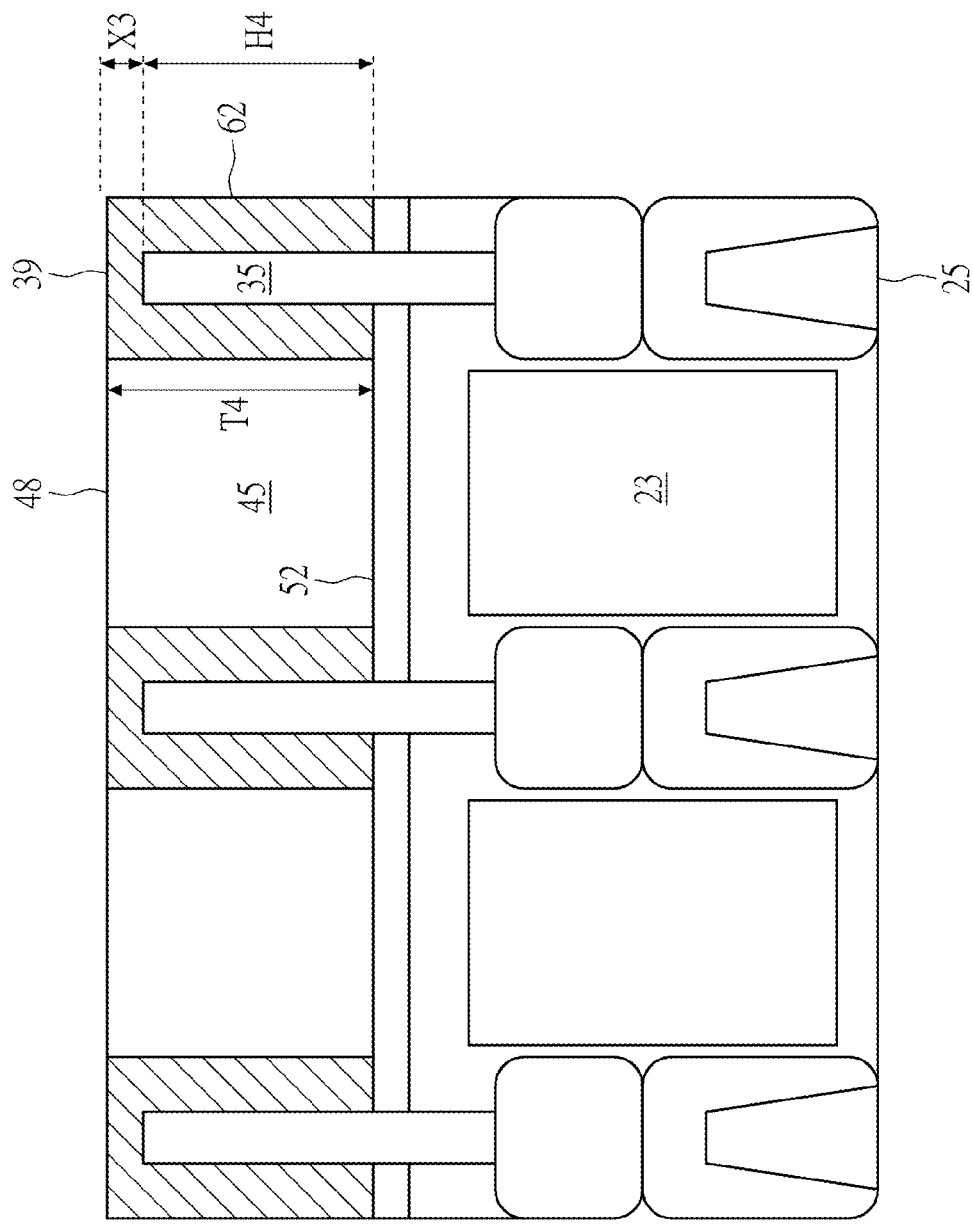

Referring to FIG. 7E, a color filter 45 is deposited within the cavity 83. The color filter 45 includes one of a variety of different colors, for example, red, green, blue, and white. The color filter 45 includes a thickness T4 substantially equal to or less than the depth D4 of the cavity 83. In an embodiment, a top surface 48 of the color filter 45 is generally coplanar with a top surface 39 of the remaining dielectric layer 62. A micro lens (not shown) is formed over the color filters 45 and the metal post 35.

Obliquely incident light is retained only in one color filter because adjacent color filters 45 are separated by a metal post 34. Effectively, the radiation wave 97 is guided to a designated radiation-sensing region 23 so that optical crosstalk is reduced. In addition, adjacent radiation-sensing regions 23 are separated by the p-type doped region 27 and the metal post 35. Due to the combination of the metal post 35 and the p-type doped regions, optical and electrical crosstalk can be reduced. Meanwhile, the problem of color filter mismatch can be solved due to the increased height of the metal posts 34 and 35.

A backside illuminated (BSI) image sensor device includes: a substrate including a front side and a back side; a radiation-sensing region in the substrate; a metal post with a longitudinal height and disposed over the back side; and a color filter adjacent to the metal post and substantially over the radiation-sensing region. The radiation-sensing region is configured to detect a radiation wave entering from the back side.

In some embodiments, the BSI image sensor further includes an oxide layer interposed between the metal post and the color filter. A total height summed up by the longitudinal height of the metal post and a thickness of the oxide layer above the metal post is substantially equal to a thickness of the color filter.

In some embodiments, the BSI image sensor further includes a micro lens disposed over the color filter and the metal post.

In some embodiments, the metal post extends into the substrate.

In some embodiments, the BSI image sensor further includes a p-type doped region in the substrate adjacent to the radiation-sensing region. The metal post contacts with the p-type doped region.

In some embodiments, the metal post is a conical structure.

A backside illuminated (BSI) image sensor device includes: a substrate including an array of radiation-sensing regions; an array of color filters over the array of radiation-sensing regions and including a surface facing toward the back side of the substrate; and a metal grid over the back side so as to separate adjacent color filters. The array of radiation-sensing regions is configured to detect a radiation wave entering from a back side of the substrate. Each color filter of the array of color filters aligns with a corresponding one sensing region of the array of radiation-sensing regions. The metal grid includes a length at least extending longitudinally to the surface facing toward the back side of the substrate.

In some embodiments, the metal grid extends into the substrate.

In some embodiments, the substrate further includes a shallow trench isolation adjacent to one sensing region of the array of radiation-sensing regions on a front side of the substrate. The metal grid contacts with the shallow trench isolation.

In some embodiments, the metal grid extends into the substrate with a depth in a range from about 0.55 microns to 5.75 microns.

In some embodiments, the metal grid includes a longitudinal height that is higher than a thickness of the array of color filters, and a micro lens is disposed on one color filter of the array of color filters so that a total thickness of the color filter and the micro lens is equal to or less than the longitudinal height of the metal grid.

In some embodiments, the BSI image sensor further includes an oxide layer with a thickness in a range between about 10 angstroms to 1000 angstroms.

In some embodiments, the BSI image sensor further includes a high-k dielectric film between the array of color filters and the back side. The high-k dielectric film orthogonally intersects with the metal grid.

A method for forming a backside illuminated (BSI) image sensor device includes: providing a substrate including a radiation-sensing region formed in the substrate; forming a metal layer over the back side; patterning the metal layer to form a metal grid; forming a dielectric layer on the back side; patterning the dielectric layer to remove a portion of the dielectric layer resulting in a cavity above the radiation-sensing region; and forming a color filter within the cavity. The radiation-sensing region is configured to detect a radiation wave entering from a back side of the substrate. The cavity includes a bottom surface area that is smaller than each unit of the metal grid. The cavity includes a depth summed up by a thickness of the dielectric layer above the metal grid and a longitudinal height of the metal grid. The color filter includes a thickness substantially equal to or less than the depth of the cavity.

In some embodiments, the method further includes etching the back side to form a trench in the substrate. The trench exposes a p-type doped region in the substrate adjacent to the radiation-sensing region.

In some embodiments, the method further includes etching the back side to form a trench in the substrate. The trench exposes a shallow trench isolation adjacent to the radiation-sensing region on the front side.

In some embodiments, the method further includes forming a high-k dielectric film on the back side.

In some embodiments, the method further includes forming a photoresist layer on the metal layer and isotropically etching the metal layer to form the metal grid with conical structures.

In some embodiments, the method further includes forming a micro lens over the color filter and the metal grid.

In some embodiments, the method further includes forming a micro lens within the cavity above the radiation-sensing region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A backside illuminated (BSI) image sensor device, comprising:
    a substrate including a front side and a back side;
    a radiation-sensing region in the substrate, and the radiation-sensing region is configured to detect a radiation wave entering from the back side;
    a metal post with a longitudinal height and disposed over the back side; and
    a color filter adjacent to the metal post and substantially over the radiation-sensing region.

2. The BSI image sensor device of claim 1, further comprising an oxide layer interposed between the metal post and the color filter, wherein a total height summed up by the longitudinal height of the metal post and a thickness of the oxide layer above the metal post is substantially equal to a thickness of the color filter.

3. The BSI image sensor device of claim 1, further comprising a micro lens disposed over the color filter and the metal post.

4. The BSI image sensor device of claim 1, wherein the metal post extends into the substrate.

5. The BSI image sensor device of claim 4, further comprising a p-type doped region in the substrate adjacent to the radiation-sensing region, wherein the metal post contacts with the p-type doped region.

6. The BSI image sensor device of claim 1, wherein the metal post is a conical structure.

7. A backside illuminated (BSI) image sensor device, comprising:
    a substrate including an array of radiation-sensing regions, and the array of radiation-sensing regions is configured to detect a radiation wave entering from a back side of the substrate;
    an array of color filters over the array of radiation-sensing regions and including a surface facing toward the back side of the substrate, wherein each color filter of the array of color filters aligns with a corresponding one sensing region of the array of radiation-sensing regions; and
    a metal grid over the back side so as to separate adjacent color filters, wherein the metal grid includes a length at least extending longitudinally to the surface facing toward the back side of the substrate.

8. The BSI image sensor device of claim 7, wherein the metal grid extends into the substrate.

9. The BSI image sensor device of claim 7, the substrate further comprising a shallow trench isolation adjacent to one sensing region of the array of radiation-sensing regions on a front side of the substrate, wherein the metal grid contacts with the shallow trench isolation.

10. The BSI image sensor device of claim 7, wherein the metal grid extends into the substrate with a depth in a range from about 0.55 microns to 5.75 microns.

11. The BSI image sensor device of claim 7, wherein the metal grid comprises a longitudinal height that is higher than a thickness of the array of color filters, and a micro lens is disposed on one color filter of the array of color filters so that a total thickness of the color filter and the micro lens is equal to or less than the longitudinal height of the metal grid.

12. The BSI image sensor device of claim 7, further comprising an oxide layer with a thickness in a range between about 10 angstroms to 1000 angstroms.

13. The BSI image sensor device of claim 7, further comprising a high-k dielectric film between the array of color filters and the back side, wherein the high-k dielectric film orthogonally intersects with the metal grid.

14. The BSI image sensor device of claim 1, wherein the metal post is made of reflective materials.

15. The BSI image sensor device of claim 1, wherein the color filter aligns with the radiation-sensing region.

16. The BSI image sensor device of claim 1, wherein a bottom surface of the color filter is coplanar with a bottom surface of the metal post.

17. The BSI image sensor device of claim 2, wherein the color filter is surrounded by the oxide layer.

18. The BSI image sensor device of claim 2, wherein the metal post is covered by the oxide layer.

19. The BSI image sensor device of claim 11, wherein the micro lens is surrounded by the metal grid.

20. The BSI image sensor device of claim 13, wherein the metal grid passes through the high-k dielectric film.

* * * * *